(12) United States Patent
Hayashi et al.

(10) Patent No.: US 11,248,091 B2
(45) Date of Patent: Feb. 15, 2022

(54) CURABLE SILICONE COMPOSITION, CURED PRODUCT THEREOF, AND OPTICAL SEMICONDUCTOR DEVICE

(71) Applicant: DOW TORAY CO., LTD., Tokyo (JP)

(72) Inventors: Akito Hayashi, Ichihara (JP); Tomohiro Iimura, Ichihara (JP)

(73) Assignee: DOW TORAY CO., LTD., Tokyo (JP)

( * ) Notice: Subject to any disclaimer, the term of this patent is extended or adjusted under 35 U.S.C. 154(b) by 308 days.

(21) Appl. No.: 16/335,833

(22) PCT Filed: Sep. 22, 2017

(86) PCT No.: PCT/JP2017/034199
§ 371 (c)(1),
(2) Date: Mar. 22, 2019

(87) PCT Pub. No.: WO2018/062009
PCT Pub. Date: Apr. 5, 2018

(65) Prior Publication Data
US 2019/0315926 A1    Oct. 17, 2019

(30) Foreign Application Priority Data

Sep. 29, 2016  (JP) .............................. JP2016-192323

(51) Int. Cl.
| C08G 77/20 | (2006.01) |
| C08G 77/12 | (2006.01) |
| H01L 33/50 | (2010.01) |
| H01L 33/56 | (2010.01) |
| H01L 33/62 | (2010.01) |

(52) U.S. Cl.
CPC ............. *C08G 77/20* (2013.01); *C08G 77/12* (2013.01); *H01L 33/502* (2013.01); *H01L 33/56* (2013.01); *H01L 33/62* (2013.01)

(58) Field of Classification Search
CPC ........ C08G 77/80; C08G 77/20; C08G 77/12; H01L 33/62; H01L 33/56; H01L 33/502
See application file for complete search history.

(56) References Cited

U.S. PATENT DOCUMENTS

| 4,755,577 A * | 7/1988 | Suzuki ................. C03C 25/106 385/128 |
| 5,696,210 A | 12/1997 | King et al. |
| 2008/0015326 A1* | 1/2008 | Kodama .............. C09D 183/04 528/15 |
| 2010/0301377 A1 | 12/2010 | Kato et al. |
| 2013/0012087 A1 | 1/2013 | Itoh et al. |
| 2014/0088281 A1 | 3/2014 | Ko et al. |
| 2015/0376344 A1 | 12/2015 | Dent et al. |
| 2016/0257788 A1 | 9/2016 | Ko et al. |
| 2016/0315026 A1 | 10/2016 | Ko et al. |
| 2016/0322546 A1 | 11/2016 | Ko et al. |
| 2016/0326340 A1 | 11/2016 | Tabei et al. |
| 2016/0336248 A1 | 11/2016 | Ko et al. |

FOREIGN PATENT DOCUMENTS

| CN | 101432331 A | 5/2009 |
| CN | 104114645 A | 10/2014 |
| CN | 105482429 A | 4/2016 |
| CN | 105829403 A | 8/2016 |
| CN | 105940055 A | 9/2016 |
| EP | 2565949 A2 | 3/2013 |
| JP | H10121025 A | 5/1998 |
| JP | H10231428 A | 9/1998 |
| JP | 2008050494 A | 3/2008 |
| JP | 2014189789 A | 10/2014 |
| JP | 2016513165 A | 5/2016 |
| JP | 2016124967 A | 7/2016 |
| TW | 201132707 A | 10/2011 |
| WO | 2015030262 A1 | 3/2015 |
| WO | 2015053412 A1 | 4/2015 |

OTHER PUBLICATIONS

Machine assisted English translation of CN101432331A obtained from https://patents.google.com/patent on Dec. 28, 2020, 23 pages.
Machine assisted English translation of CN105482429A obtained from https://patents.google.com/patent on Dec. 28, 2020, 16 pages.
International Search Report for International Application No. PCT/JP2017/034199 dated Oct. 17, 2017, 2 pages.
Machine assisted English translation of JPH10231428A obtained from https://worldwide.espacenet.com on Mar. 20, 2019, 15 pages.
Machine assisted English translation of JP2014189789A obtained from https://worldwide.espacenet.com on Mar. 20, 2019, 62 pages.
Machine assisted English translation of WO2015053412A1 obtained from https://worldwide.espacenet.com on Mar. 20, 2019, 17 pages.
Machine assisted English translation of JP2016124967A obtained from https://worldwide.espacenet.com on Mar. 20, 2019, 45 pages.

* cited by examiner

*Primary Examiner* — Kuo Liang Peng
(74) *Attorney, Agent, or Firm* — Warner Norcross + Judd LLP

(57) ABSTRACT

A curable silicone composition is disclosed. The curable silicone composition comprises: (A) a linear organopolysiloxane having at least two silicon atom-bonded alkenyl groups per molecule, wherein at least 5 mole % of all silicon atom-bonded organic groups are aryl groups; (B) an organopolysiloxane containing siloxane units represented by the general formula $R^1{}_3SiO_{1/2}$ where each $R^1$ represents an independently selected monovalent hydrocarbon group, and siloxane units represented by the general formula $SiO_{4/2}$, wherein the amount of alkenyl groups is at least 6% by weight; (C) an organopolysiloxane having at least two silicon atom-bonded hydrogen atoms per molecule; and (D) a hydrosilylation reaction catalyst. The curable silicone composition forms a cured product with little weight reduction, little change in hardness, and little crack generation after thermal aging.

8 Claims, 1 Drawing Sheet

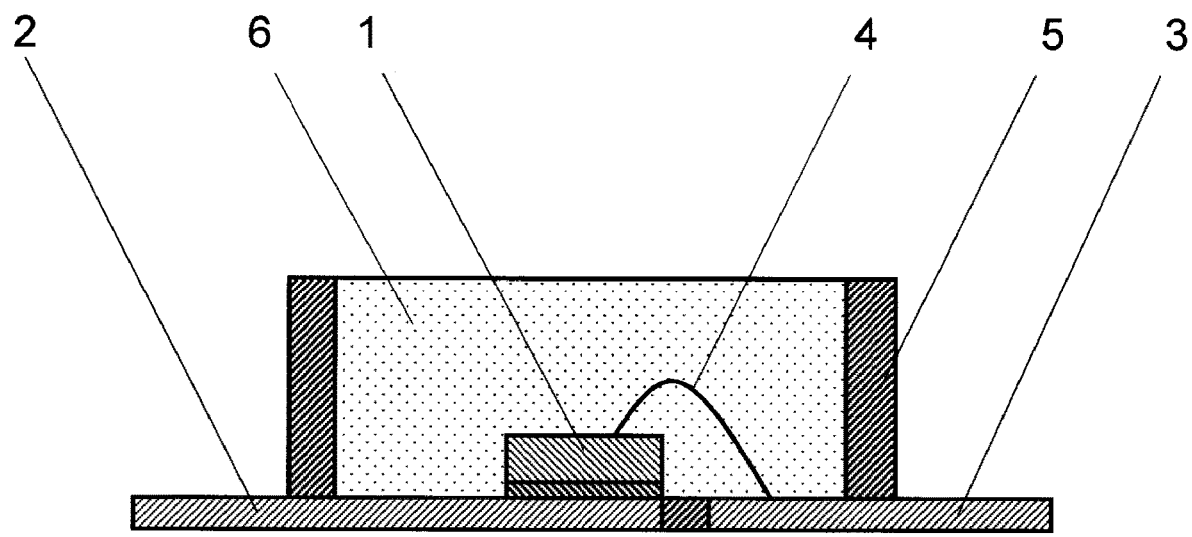

CURABLE SILICONE COMPOSITION, CURED PRODUCT THEREOF, AND OPTICAL SEMICONDUCTOR DEVICE

CROSS-REFERENCE TO RELATED APPLICATIONS

This application is the National Stage of International Application No. PCT/JP2017/034199 filed on 22 Sep. 2017, which claims priority to and all advantages of Japan Patent Appl. No. 2016-192323 filed on 29 Sep. 2016, the content of which is hereby incorporated by reference.

TECHNICAL FIELD

The present invention relates to a curable silicone composition, a cured product thereof, and an optical semiconductor device prepared using the composition.

BACKGROUND ART

Curable silicone compositions that can be cured by a hydrosilylation reaction are cured to form a cured product with excellent electrical properties, allowing them to be used in various applications. It is known that organopolysiloxanes having siloxane units represented by the formula: $SiO_{4/2}$ are added to curable silicone compositions to control the hardness and strength of cured products.

For example, Patent Document 1 discloses a curable silicone composition comprising: an organopolysiloxane containing siloxane units represented by the formula: $R_3SiO_{1/2}$ and siloxane units represented by the formula: $SiO_{4/2}$, wherein R is the same or different monovalent hydrocarbon group, but at least one R per molecule is an alkenyl group, and wherein the ratio of the siloxane units represented by the formula: $R_3SiO_{1/2}$ with regard to the siloxane units represented by the formula: $SiO_{4/2}$ is 0.5 to 1.5 and the amount of alkenyl group is 0.01 to 22 wt. %; an organopolysiloxane having at least two silicon bonded hydrogen atoms per molecule; a hydrosilylation reaction catalyst; and if necessary, a straight chain organopolysiloxane having at least two alkenyl groups per molecule, is rapidly cured to obtain a pressure sensitive adhesive having high green strength, then slowly cured to obtain a high strength permanent adhesive.

Furthermore, Patent Document 2 discloses a curable silicone composition comprising: a linear organopolysiloxane having at least two vinyl groups per molecule; an organopolysiloxane containing siloxane units represented by the formula: $SiO_{4/2}$, siloxane units represented by the formula: $(CH_2=CH)R'_2SiO_{1/2}$, and siloxane units represented by the formula: $R'_3SiO_{1/2}$ (wherein R' represents a monovalent hydrocarbon group that does not have an aliphatic unsaturated bond); an organopolysiloxane having at least one silicon bonded alkoxy group and at least two silicon bonded hydrogen atoms per molecule; and a hydrosilylation reaction catalyst, is releasable at ambient temperature or during low temperature curing, forming a cured product that demonstrates excellent adhesion by further heating at high temperatures.

Furthermore, Patent Document 3 discloses a curable silicone composition comprising: a linear organopolysiloxane having at least two alkenyl groups per molecule and containing a diarylsiloxane unit; at least two organopolysiloxanes with different weight average molecular weights, containing siloxane units represented by the formula: $R'_3SiO_{1/2}$ (wherein R' represents the same or different monovalent hydrocarbon group that does not have an aliphatic unsaturated bond), siloxane units represented by the formula: $R'_2R''SiO_{1/2}$ (wherein R' represents the same as above, while R'' represents an alkenyl group), and siloxane units represented by the formula: $SiO_{4/2}$; an organopolysiloxane having at least two silicon bonded hydrogen atoms per molecule; and a hydrosilylation reaction catalyst, forms a cured product of moderate hardness and strength.

However, in Patent Documents 1 and 2, when the cured product obtained by curing the curable silicone composition undergoes thermal aging, problems such as wall thinning due to weight reduction, change in hardness, and crack generation were not addressed, and when the curable silicone composition is used as a sealing agent of high intensity LED with high heat generation, the reliability of the LED is problematically reduced. Furthermore, Patent Document 3 describes that the curable silicone composition is used as an LED sealing agent, but similarly, when the cured product undergoes thermal aging, problems such as wall thinning due to weight reduction, change in hardness, and crack generation are of no concern, and when the curable silicone composition is used as a sealing agent of high intensity LED with high heat generation, the reliability of the LED is problematically reduced.

PRIOR ART DOCUMENTS

Patent Documents

Patent Document 1: Japanese Unexamined Patent Application Publication No. H10-121025 A
Patent Document 2: Japanese Unexamined Patent Application Publication No. H10-231428 A
Patent Document 3: International Publication No. WO 2015/030262 A1 SUMMARY OF THE INVENTION

Problems to be Solved by the Invention

An object of the present invention is to provide a curable silicone composition forming a cured product with low weight reduction, hardness change, and crack generation after thermal aging. Furthermore another object of the present invention is to provide a cured product with low weight reduction, hardness change, and crack generation after thermal aging, and to provide an optical semiconductor device with excellent reliability.

Means for Solving the Problems

The curable silicone composition of the present invention comprises:

(A) 100 parts by weight of a linear organopolysiloxane having at least two silicon atom-bonded alkenyl groups per molecule, where at least 5 mole % of all silicon atom-bonded organic groups are aryl groups;

(B) 1 to 100 parts by weight of an organopolysiloxane containing siloxane units represented by the formula: $R^1_3SiO_{1/2}$ (wherein $R^1$ represents the same or different monovalent hydrocarbon group) and siloxane units represented by the formula: $SiO_{4/2}$, wherein the amount of alkenyl groups is at least 6% by weight;

(C) an organopolysiloxane having at least two silicon atom-bonded hydrogen atoms per molecule, in an amount that the silicon atom-bonded hydrogen atoms in the component is 0.1 to 10 moles with regard to 1 mole of the total alkenyl groups included in components (A) and (B); and (D) a hydrosilylation reaction catalyst, in an amount that promotes curing of the composition.

The cured product of the present invention is formed by curing the curable silicone composition described above.

Furthermore, the optical semiconductor device of the present invention has an optical semiconductor element that is sealed by the cured product of the curable silicone composition described above.

Effects of the Invention

The curable silicone composition of the present invention forms a cured product with low weight reduction, hardness change, and crack generation after thermal aging. The cured product of the present invention has low weight reduction, hardness change, and crack generation after thermal aging. Furthermore, the optical semiconductor device of the present invention has excellent reliability.

BRIEF DESCRIPTION OF THE DRAWINGS

FIG. 1 is a cross sectional view of an LED which is one example of an optical semiconductor device of the present invention.

MODE FOR CARRYING OUT THE INVENTION

First, the curable silicone composition of the present invention will be described in detail.

Component (A) is a linear organopolysiloxane having at least two silicon atom-bonded alkenyl groups per molecule. Examples of the alkenyl groups in component (A) include vinyl groups, allyl groups, isopropenyl groups, butenyl groups, hexenyl groups, cyclohexenyl groups, and other alkenyl groups with 2 to 12 carbon atoms, but vinyl groups are preferable. The silicon atoms bonded to the alkenyl group are not limited, and examples include silicon atoms on a molecular chain terminal and/or silicon atoms other than on a molecular chain terminal. Furthermore, examples of a silicon atom-bonded organic group other than the alkenyl groups in component (A) include monovalent hydrocarbon groups with 1 to 12 carbon atoms that do not have an aliphatic unsaturated bond, and specific examples include: methyl groups, ethyl groups, propyl groups, butyl groups, pentyl groups, hexyl groups, heptyl groups, octyl groups, and other alkyl groups with 1 to 12 carbon atoms; phenyl groups, tolyl groups, xylyl groups, and other aryl groups with 6 to 12 carbon atoms; benzyl groups, phenethyl groups, and other aralkyl groups with 7 to 12 carbon atoms; and 3-chloropropyl groups, 3,3,3-trifluoropropyl groups, and other halogen-substituted alkyl groups with 1 to 12 carbon atoms. Note that in component (A), at least 5 mole % of all the silicon atom-bonded organic groups are aryl groups and preferably at least 10 mole %, alternatively at least 15 mole % are aryl groups. This is because when component (A) with this amount of aryl groups is combined with component (B) described below, the crack resistance of an obtained cured product at a high temperature such as 250° C. will be excellent.

The molecular structure of component (A) essentially has a linear, but a portion of the molecular chain may somewhat branched. The viscosity of component (A) at 25° C. is not limited, but is preferably within a range of 100 to 1,000,000 mPa·s, alternatively within a range of 100 to 100,000 mPa·s.

The organopolysiloxane for component (A), for example, can be expressed by the general formula:

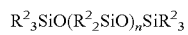

In the formula, $R^2$ represents the same or different monovalent hydrocarbon group, with specific examples including: methyl groups, ethyl groups, propyl groups, butyl groups, pentyl groups, hexyl groups, heptyl groups, octyl groups, and other alkyl groups with 1 to 12 carbon atoms; vinyl groups, allyl groups, isopropenyl groups, butenyl groups, hexenyl groups, cyclohexenyl groups, and other alkenyl groups with 2 to 12 carbon atoms; phenyl groups, tolyl groups, xylyl groups, and other aryl groups with 6 to 12 carbon atoms; benzyl groups, phenethyl groups, and other aralkyl groups with 7 to 12 carbon atoms; 3-chloropropyl groups, 3,3,3-trifluoropropyl groups, and other halogen substituted alkyl groups with 1 to 12 carbon atoms. Note that in the formula, at least two of $R^2$ represent the aforementioned alkenyl groups, with at least 5 mole % of all $R^2$ representing the aforementioned aryl groups. Furthermore, in the formula, "n" represents an integer of 1 or more, and preferably an integer where the viscosity of component (A) at 25° C. is within a range of 100 to 1,000,000 mPa·s, alternatively within a range of 100 to 100,000 mPa·s.

Examples of component (A) include: diphenylpolysiloxanes capped at both molecular terminals with dimethylvinylsiloxy groups, copolymers of dimethylsiloxane and diphenylsiloxane capped at both molecular terminals with dimethylvinylsiloxy groups, copolymers of dimethylsiloxane, methylvinylsiloxane and diphenylsiloxane capped at both molecular terminals with dimethylvinylsiloxy groups, methylphenylpolysiloxanes capped at both molecular terminals with dimethylvinylsiloxy groups, copolymers of dimethylsiloxane and methylphenylsiloxane capped at both molecular terminals with dimethylvinylsiloxy groups, copolymers of methylvinylsiloxane and diphenylsiloxane capped at both molecular terminals with trimethylsiloxy groups, copolymers of dimethylsiloxane, methylvinylsiloxane and diphenylsiloxane capped at both molecular terminals with trimethylsiloxy groups, and mixtures of two or more types thereof.

Component (B) is an organopolysiloxane containing siloxane units represented by the formula: $R^1_3SiO_{1/2}$ and siloxane units represented by the formula: $SiO_{4/2}$. In component (B), while the ratio of siloxane units represented by formula: $R^1_3SiO_{1/2}$ with regard to siloxane units represented by the formula: $SiO_{4/2}$ is not limited, it is preferably within a range of 0.6 to 1.8, alternatively within a range of 0.7 to 1.7, and alternatively within a range of 0.8 to 1.6. In the formula, $R^1$ represents the same or a different monovalent hydrocarbon group, wherein examples include monovalent hydrocarbon groups with 1 to 12 carbon atoms, with specific examples including: methyl groups, ethyl groups, propyl groups, butyl groups, pentyl groups, hexyl groups, octyl groups, and other alkyl groups with 1 to 12 carbon atoms; vinyl groups, allyl groups, isopropenyl groups, butenyl groups, hexenyl groups, cyclohexenyl groups, and other alkenyl groups with 2 to 12 carbon atoms; phenyl groups, tolyl groups, xylyl groups, and other aryl groups with 6 to 12 carbon atoms; benzyl groups, phenethyl groups, and other aralkyl groups with 7 to 12 carbon atoms; 3-chloropropyl groups, 3,3,3-trifluoropropyl groups, and other halogen substituted alkyl groups with 1 to 12 carbon atoms, with methyl groups, vinyl groups, and phenyl groups being preferable. Note that at least one $R^1$ per molecule is the aforementioned alkenyl group. Furthermore, the amount of alkenyl groups in component (B) is preferably at least 6% by weight, alternatively at least 10% by weight, alternatively at least 12% by weight, alternatively at least 13% by weight, alternatively at least 14% by weight, and alternatively at least 15% by weight. This is because when the aforementioned component (A) and component (B) with a high amount of alkenyl groups are combined, weight reduction of the obtained cured product at a high temperature such as 250° C. is improved.

Examples of component (B) include: an organopolysiloxane containing siloxane units represented by the formula: $(CH_3)_3SiO_{1/2}$, siloxane units represented by the formula: $(CH_3)_2(CH_2=CH)SiO_{1/2}$, and siloxane units represented by the formula: $SiO_{4/2}$; an organopolysiloxane containing siloxane units represented by the formula: $(CH_3)_2(CH_2=CH)SiO_{1/2}$ and siloxane units represented by the formula: $SiO_{4/2}$; an organopolysiloxane containing siloxane units represented by the formula: $(CH_3)(CH_2=CH)_2SiO_{1/2}$ and siloxane units represented by the formula: $SiO_{4/2}$; an organopolysiloxane containing siloxane units represented by the formula: $(CH_3)_3SiO_{1/2}$, siloxane units represented by the formula: $(CH_3)(CH_2=CH)_2SiO_{1/2}$, and siloxane units represented by the formula: $SiO_{4/2}$; an organopolysiloxane containing siloxane units represented by the formula: $(CH_2=CH)_3SiO_{1/2}$ and siloxane units represented by the formula: $SiO_{4/2}$; and an organopolysiloxane containing siloxane units represented by the formula: $(CH_3)_3SiO_{1/2}$, siloxane units represented by the formula: $(CH_2=CH)_3SiO_{1/2}$, and siloxane units represented by the formula: $SiO_{4/2}$. Two or more of such organopolysiloxanes may be combined, or two or more of those having a small amount of alkenyl groups and those having a large amount of alkenyl groups may be combined to obtain organopolysiloxanes having the abovementioned amount of alkenyl groups.

The amount of component (B) is an amount within a range of 1 to 100 parts by weight, and preferably within a range of 1 to 50 parts by weight, alternatively within a range of 1 to 20 parts by weight, and alternatively within a range of 1 to 10 parts by weight, with regard to 100 parts by weight of component (A). This is because when the amount of component (B) is not less than the lower limit of the aforementioned range, the obtained cured product will have an appropriate hardness, and thus surface tack will be less likely to occur, but on the other hand, when the amount is not more than the upper limit of the aforementioned range, the mechanical properties of the obtained cured product will be excellent.

Component (C) is an organopolysiloxane having at least two silicon atom-bonded hydrogen atoms per molecule. The silicon atom bonded to the hydrogen atom in component (C) is not limited, and examples include silicon atoms on a terminal of a molecular chain and/or other silicon atoms. Furthermore, examples of a silicon atom-bonded organic group in component (C) include monovalent hydrocarbon groups with 1 to 12 carbon atoms that do not have an aliphatic unsaturated bond, and specific examples include: methyl groups, ethyl groups, propyl groups, butyl groups, pentyl groups, hexyl groups, octyl groups, and other alkyl groups with 1 to 12 carbon atoms; phenyl groups, tolyl groups, xylyl groups, and other aryl groups 6 to 12 carbon atoms; benzyl groups, phenethyl groups, and other aralkyl groups with 7 to 12 carbon atoms; and 3-chloropropyl groups, 3,3,3-trifluoropropyl groups, and other halogen-substituted alkyl groups with 1 to 12 carbon atoms, and methyl groups and phenyl groups are preferable.

The molecular structure of component (C) is not particularly limited, and examples include a straight chain, straight chain with a branched portion, branched chain, cyclic, and a resinous structure. Straight chain, straight chain with a branched portion, and a resin structure are preferable. Furthermore, the viscosity of component (C) at 25° C. is not limited, but is preferably within a range of 1 to 10,000 mPa·s, alternatively within a range of 1 to 1,000 mPa·s.

Examples of component (C) include 1,1,3,3-tetramethyl disiloxanes, 1,3,5,7-tetramethyl cyclotetrasiloxanes, tris(dimethylhydrogensiloxy) methylsilanes, tris(dimethylhydrogensiloxy) phenylsilanes, 1-glycidoxypropyl-1,3,5,7-tetramethyl cyclotetrasiloxanes, 1,5-diglycidoxypropyl-1,3,5,7-tetramethyl cyclotetrasiloxanes, 1-glycidoxypropyl-5-trimethoxysilylethyl-1,3,5,7-tetramethyl cyclotetrasiloxanes, methylhydrogenpolysiloxanes capped at both molecular terminals with trimethylsiloxy groups, copolymers of dimethylsiloxane and methylhydrogensiloxane capped at both molecular terminals with trimethylsiloxy groups, dimethylpolysiloxanes capped at both molecular terminals with dimethylhydrogensiloxy groups, copolymers of dimethylsiloxane and methylhydrogensiloxane capped at both molecular terminals with dimethylhydrogensiloxy groups, copolymers of methylhydrogensiloxane and diphenylsiloxane capped at both molecular terminals with trimethylsiloxane groups, copolymers of methylhydrogensiloxane, diphenylsiloxane and dimethylsiloxane capped at both molecular terminals with trimethylsiloxy groups, hydrolysis condensates of trimethoxysilane, copolymers containing $(CH_3)_2HSiO_{1/2}$ units and $SiO_{4/2}$ units, copolymers containing $(CH_3)_2HSiO_{1/2}$ units, $SiO_{4/2}$ units, and $(C_6H_5)SiO_{3/2}$ units, or two or more mixtures thereof.

The amount of component (C) is an amount where the silicon atom-bonded hydrogen atoms in the component are within a range of 0.1 to 10 moles with regard to 1 mole of a total alkenyl groups in components (A) and (B), and is preferably an amount within a range of 0.5 to 5 moles. This is because when the amount of component (C) is not less than the lower limit of the aforementioned range, the obtained cured product will have an appropriate hardness, but on the other hand, when the amount is not more than the upper limit of the aforementioned range, the curability of the obtained composition will improve.

Component (D) is a hydrosilylation reaction catalyst promoting curing of the present composition. Examples of component (D) include platinum based catalysts, rhodium based catalysts, and palladium based catalysts, with platinum based catalysts being preferable. Examples of the platinum-based catalyst include platinum-based compounds, such as platinum fine powder, platinum black, platinum-supporting silica fine powder, platinum-supporting activated carbon, chloroplatinic acid, alcohol solutions of chloroplatinic acid, olefin complexes of platinum, and alkenylsiloxane complexes of platinum.

The amount of component (D) is an amount that promotes curing of the present composition, and is preferably an amount where metal atoms in the catalyst are within a range of 0.01 to 1,000 ppm, alternatively within a range of 0.01 to 500 ppm, and alternatively within a range of 0.1 to 100 ppm, with regard to the present composition. This is because when the amount of component (D) is not less than the lower limit of the aforementioned range, the obtained composition is sufficiently cured, but on the other hand, when the amount is not more than the upper limit of the aforementioned range, problems such as coloring or the like of the cured product are less likely to occur.

The present composition may contain (E) a hydrosilylation reaction inhibitor as an arbitrary component that extends the usable time at ambient temperature and improves storage stability. Examples of component (E) include: 1-ethynyl cyclohexan-1-ol, 2-methyl-3-butyn-2-ol, 3,5-dimethyl-1-hexyn-3-ol, 2-phenyl-3-butyn-2-ol, and other alkyne alcohols; 3-methyl-3-penten-1-yne, 3,5-dimethyl-3-hexen-1-yne, and other ene-yne compounds; 1,3,5, 7-tetramethyl-1,3,5,7-tetravinyl cyclotetrasiloxane, 1,3,5,7-tetramethyl-1,3,5,7-tetrahexenyl cyclotetrasiloxane, and other methylalkenylsiloxane oligomers; dimethyl bis(3-methyl-1-butyn-3-oxy) silane, methyl vinyl bis(3-methyl-1-butyn-3-oxy) silane, and other alkynoxysilanes; and triallyl isocyanurate compounds.

The amount of component (E) is not limited, but is preferably within a range of 0.01 to 3 parts by weight, alternatively within a range of 0.01 to 1 parts by weight, with regard to 100 parts by weight of a total amount of components (A) to (C). This is because when the amount of component (E) is not less than the lower limit of the aforementioned range, an appropriate usable time of the present composition is provided, but on the other hand, when the amount is not more than the upper limit of the aforementioned range, an appropriate workability is provided.

Furthermore, the present composition may contain (F) an adhesion promoter in order to further improve adhesion onto a contacting substrate during curing. An organosilicon compound having 1 or 2 or more silicon atom-bonded alkoxy groups per molecule is preferable as component (F). Examples of the alkoxy groups include methoxy groups, ethoxy groups, propoxy groups, butoxy groups, and methoxyethoxy groups, and methoxy groups or ethoxy groups are particularly preferable. Furthermore, exemplary groups other than the silicon atom-bonded alkoxy group in the organosilicon compound include: alkyl groups, alkenyl groups, aryl groups, aralkyl groups, halogenated alkyl groups, and other substituted or unsubstituted monovalent hydrocarbon groups; 3-glycidoxypropyl groups, 4-glycidoxybutyl groups, and other glycidoxyalkyl groups; 2-(3,4-epoxycyclohexyl) ethyl groups, 3-(3,4-epoxycyclohexyl) propyl groups, and other epoxycyclohexyl alkyl groups; 4-epoxybutyl groups, 8-epoxyoctyl groups, and other epoxyalkyl groups; 3-methacryloxypropyl groups, and other monovalent organic groups containing an acrylic group; isocyanate groups; isocyanurate groups; and hydrogen atoms.

The organosilicon compound preferably has a group that can react with an aliphatic unsaturated hydrocarbon group or silicon atom-bonded hydrogen atom in the present composition, and specifically preferably has a silicon atom-bonded aliphatic unsaturated hydrocarbon group or silicon atom-bonded hydrogen atom. Examples of the molecular structure of the silicon compound include a straight chain, straight chain with a branched portion, branched chain, cyclic, and a net-like structure, and a straight chain, branched chain, and a net-like structure are particularly preferable. Examples of this organosilicon compound include 3-glycidoxypropyl trimethoxysilane, 2-(3,4-epoxycyclohexyl)ethyl trimethoxysilane, 3-methacryloxypropyl trimethoxysilane, and other silane compounds; siloxane compounds having at least one silicon atom-bonded alkenyl group or silicon atom-bonded hydrogen atom, and at least one silicon atom-bonded alkoxy group per molecule; and mixtures of a silane compound or siloxane compound having at least one silicon atom-bonded alkoxy group and a siloxane compound having at least one silicon atom-bonded hydroxyl group and at least one silicon atom-bonded alkenyl group per molecule.

The amount of component (F) is not limited, but is preferably within a range of 0.01 to 10 parts by weight, alternatively within a range of 0.1 to 3 parts by weight, with regard to 100 parts by weight of a total amount of components (A) to (C). This is because when the amount of component (F) is not less than the lower limit of the aforementioned, adhesion will be favorable, but on the other hand, when the amount is not more than the upper limit of the aforementioned range, storage stability will be favorable.

Furthermore, the present composition may contain an organopolysiloxane containing cerium in order to further suppress cracking due to thermal aging of the obtained cured product. The organopolysiloxane containing cerium can be prepared, for example, by reacting cerium chloride, or cerium 2-ethylhexanoate, cerium naphthenate, cerium oleate, cerium laurate, cerium stearate, or other cerium salt of a carboxylic acid with an alkali metal salt of an organopolysiloxane containing a silanol group such potassium salts of a diorganopolysiloxane capped at both molecular terminals with silanol groups, sodium salts of a diorganopolysiloxane capped at both molecular terminals with silanol groups, potassium salts of a diorganopolysiloxane capped at one molecular terminal with a silanol group and capped at another molecular terminal with a triorganosiloxy group, sodium salts of a diorganopolysiloxane capped at one molecular terminal with a silanol group and capped at anther molecular terminal with a triorganosiloxy group, and the like.

The amount of organopolysiloxane containing cerium is not limited, but is preferably an amount where cerium atoms with regard to the present composition is within a range of 10 to 2,000 ppm by weight units, alternatively within a range of 20 to 2,000 ppm by weight units, alternatively within a range of 20 to 1,000 ppm by weight units, and alternatively within a range of 20 to 500 pm by weight units. This is because when the amount of the organopolysiloxane containing cerium is not less than the lower limit of the aforementioned range, the heat resistance of the obtained composition can be improved, but on the other hand, when the amount is not more than the upper limit of the aforementioned range, change in luminescent chromaticity when used in an optical semiconductor device can be reduced.

Furthermore, the present composition may contain a phosphor as another arbitrary component. Examples of the phosphor include yellow, red, green, and blue light phosphors, which include oxide phosphors, oxynitride phosphors, nitride phosphors, sulfide phosphors, oxysulfide phosphors, and the like, which are widely used in light emitting diodes (LED). Examples of the oxide phosphors include yttrium, aluminum, and garnet-type YAG green to yellow light phosphors containing cerium ions; terbium, aluminum, and garnet-type TAG yellow light phosphors containing cerium ions; and silicate green to yellow light phosphors containing cerium or europium ions. Exemplary oxynitride phosphors include silicon, aluminum, oxygen, and nitrogen type SiAlON red to green light phosphors containing europium ions. Examples of nitride phosphors include calcium, strontium, aluminum, silicon, and nitrogen-type CASN red light phosphors containing europium ions. Exemplary sulfide phosphors include ZnS green light phosphors containing copper ions or aluminum ions. Exemplary oxysulfide phosphors include $Y_2O_2S$ red light phosphors containing europium ions. Two or more of these phosphors may be used in combination.

The average particle size of the phosphor is not limited, but is preferably within a range of 1 to 50 µm, alternatively within a range of 5 to 20 µm. This is because when the average particle size of the phosphor is not less than the lower limit of the aforementioned range, the viscosity will be suppressed from increasing during mixing, but on the other hand, when the average particle size is not more than the upper limit of the aforementioned range, light transparency will be favorable.

The amount of the phosphor is not limited, but is preferably within a range of 0.1 to 70% by weight of the present composition, is preferably 70% by weight or less when considering handling workability, and is preferably 5% by weight or more when considering photoconductivity to white.

The present composition has excellent fluidity and filling properties, and depending on the application, while the viscosity thereof is not limited, it is generally preferably within a range of 100 to 500,000 mPa·s at 25° C., particularly preferably within a range of 100 to 100,000 mPa·s.

Next, the cured product of the present invention will be described in detail.

The cured product of the present invention is formed by curing the curable silicone composition described above. The shape of the cured product is not particularly limited, and examples include a sheet shape and a film shape. The cured product can be handled as a simple substance or may also be handled in a condition where the cured product covers or seals an optical semiconductor element or the like.

Next, the optical semiconductor device of the present invention will be explained in detail.

The optical semiconductor device of the present invention is formed by sealing an optical semiconductor element using the cured product of the curable silicone composition described above. Examples of the optical semiconductor device of the present invention include light emitting diodes (LED), photocouplers, and CCDs. Examples of optical semiconductor elements include light emitting diode (LED) chips and solid-state image sensing devices.

FIG. 1 illustrates a cross-sectional view of an LED which is one example of an optical semiconductor device of the present invention. In the LED illustrated in FIG. 1, an optical semiconductor element 1 is die-bonded to a lead frame 2, and the optical semiconductor element 1 is further wire bonded to a lead frame 3 by a bonding wire 4. Furthermore, a frame material 5 is provided on a periphery of the optical semiconductor element 1, and the optical semiconductor element 1 on an inner side of the frame material 5 is sealed by a cured product 6 of the curable silicone composition of the present invention.

An example of a method of manufacturing the LED illustrated in FIG. 1 includes a method of die bonding the optical semiconductor element 1 to the lead frame 2, wire bonding the optical semiconductor element 1 and the lead frame 3 by a gold bonding wire 4, and then filling the curable silicone composition inside the frame material 5 provided on a periphery of the optical semiconductor element 1 and then heating to 50 to 200° C.

EXAMPLES

The curable silicone composition, cured product, and optical semiconductor device of the present invention will be described in detail using Practical Examples and Comparative Examples. Note that the viscosity in the Examples is the value at 25° C., wherein Me, Vi, and Ph respectively represent a methyl group, vinyl group, and phenyl group. The properties of the cured product of the curable silicone composition were measured as follows.

<Viscosity of Curable Silicone Composition and Each Component>

The viscosity (mPa·s) at 25° C. of the curable silicone composition and each component were measured by a rotational viscometer in accordance with JIS K7117-1.

<Refractivity of Curable Silicone Composition>

The refractivity at 25° C. of the curable silicone composition before curing was measured by an Abbe type refractometer. Note that a 589 nm light source was used for the measurement.

<Hardness of Cured Product>

The curable silicone composition was heated for 1 hour in a 150° C. hot air circulation oven to prepare a cured product. The hardness of the cured product was measured by a type A durometer specified in JIS K 6253.

<Weight Reduction of Cured Product>

The curable silicone composition was heated for 1 hour in a 150° C. hot air circulation oven to prepare a 2 mm thick cured product. The weight change ratio of the cured product before and after aging when the cured product was aged for 10 hours in a 250° C. hot air circulation oven was determined and evaluated as follows.

○: Weight change rate of cured product less than 5%
x: Weight change rate of cured product 5% or higher <Hardness Change of Cured Product>

The curable silicone composition was heated for 1 hour in a 150° C. hot air circulation oven to prepare a cured product. The hardness change rate before and after aging when the cured product was aged for 250 hours in a 250° C. hot air circulation oven was determined and evaluated as follows.

○: Weight change rate is 150% or higher
x: Weight change rate is less than 150%

<Crack Resistance>

The curable silicone composition was heated for 1 hour in a 150° C. hot air circulation oven to prepare a cured product. The appearance when the cured product was aged in a 250° C. hot air circulation oven was observed and evaluated.

○: No cracking at 2000 hours or longer
Δ: Cracking at 500 hours to 2000 hours
x: Cracking at less than 500 hours Practical Examples 1 to 13 and Comparative Examples 1 to 5

The curable silicone compositions were prepared at the compositions (parts by weight) shown in Tables 1 to 3 using the following components. Note that Tables 1 to 3 show the molar number of silicon atom-bonded hydrogen atoms in component (C) with regard to 1 mole of a total vinyl groups in components (A) and (B). Furthermore, in Tables 1 to 3, the amount of component (D-1) is expressed as the amount (ppm) of platinum metal in weight units, with regard to the curable silicone composition.

The following components were used as component (A).

Component (A-1): a copolymer of dimethylsiloxane and diphenylsiloxane (amount of phenyl groups=19.8 mole %) having a viscosity of 13,000 mPa·s and represented by the formula:

$ViMe_2SiO(Me_2SiO)_{200}(Ph_2SiO)_{50}SiMe_2Vi$

Component (A-2): a methylphenylpolysiloxane (amount of phenyl groups=43.5 mole %) having a viscosity of 2,500 mPa·s and represented by the formula:

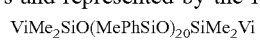
$ViMe_2SiO(MePhSiO)_{20}SiMe_2Vi$

Component (A-3): a dimethylpolysiloxane having a viscosity of 2,100 mPa·s and represented by the formula:

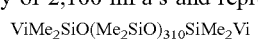
$ViMe_2SiO(Me_2SiO)_{310}SiMe_2Vi$

Component (A-4): a copolymer of dimethylsiloxane and diphenylsiloxane (amount of phenyl groups=13.2 mole %) having a viscosity of 8,300 mPa·s and represented by the formula:

$ViMe_2SiO(Me_2SiO)_{260}(Ph_2SiO)_{40}SiMe_2Vi$

Component (A-5): a copolymer of dimethylsiloxane and diphenylsiloxane (amount of phenyl groups=15.8 mol %) having a viscosity of 6,200 mPa·s and represented by the formula:

$ViMe_2SiO(Me_2SiO)_{210}(Ph_2SiO)_{40}SiMe_2Vi$

Component (A-6): a copolymer of dimethylsiloxane and diphenylsiloxane (amount of phenyl groups=23.7 mole %) having a viscosity of 17,000 mPa·s and represented by the formula:

$ViMe_2SiO(Me_2SiO)_{190}(Ph_2SiO)_{60}SiMe_2Vi$

Component (A-7): a copolymer of dimethylsiloxane and diphenylsiloxane (amount of phenyl groups=6.5 mole %) having a viscosity of 900 mPa·s and represented by the formula:

$ViMe_2SiO(Me_2SiO)_{140}(Ph_2SiO)_{10}SiMe_2Vi$

Component (A-8): a copolymer of dimethylsiloxane and diphenylsiloxane (amount of phenyl groups=13.1 mole %) having a viscosity of 1,800 mPa·s and represented by the formula:

$ViMe_2SiO(Me_2SiO)_{130}(Ph_2SiO)_{20}SiMe_2Vi$

Component (A-9): a copolymer of dimethylsiloxane and diphenylsiloxane (amount of phenyl groups=32.3 mole %) having a viscosity of 14,000 mPa·s and represented by the formula:

$ViMe_2SiO(Me_2SiO)_{60}(Ph_2SiO)_{30}SiMe_2Vi$

The following components were used independently or in combination as component (B).

Component (B-1): an organopolysiloxane (amount of vinyl groups=18.7% by weight) represented by the average unit formula:

$(Me_2ViSiO_{1/2})_{0.55}(Me_3SiO_{1/2})_{0.05}(SiO_{4/2})_{0.40}$

Component (B-2): an organopolysiloxane (amount of vinyl groups=3.8% by weight) represented by the average unit formula:

$(Me_2ViSiO_{1/2})_{0.10}(Me_3SiO_{1/2})_{0.40}(SiO_{4/2})_{0.50}$

Component (B-3): an organopolysiloxane (amount of vinyl groups=5.4% by weight) represented by the average unit formula:

$(Me_2ViSiO_{1/2})_{0.15}(Me_3SiO_{1/2})_{0.45}(SiO_{4/2})_{0.40}$

Component (B-4): an organopolysiloxane (amount of vinyl groups=20.3% by weight) represented by the average unit formula:

$(Me_2ViSiO_{1/2})_{0.60}(SiO_{4/2})_{0.40}$

Component (B-5): an organopolysiloxane (amount of vinyl groups=12.3% by weight) represented by the average unit formula:

$(Me_2ViSiO_{1/2})_{0.35}(Me_3SiO_{1/2})_{0.25}(SiO_{4/2})_{0.40}$

The following components were used as component (C).

Component (C-1): an organopolysiloxane having a viscosity of 20 mPa·s and represented by the average unit formula:

$(Me_2HSiO_{1/2})_{0.60}(SiO_{4/2})_{0.40}$

Component (C-2): an organopolysiloxane having a viscosity of 30 mPa·s and represented by the average unit formula:

$(Me_2HSiO_{1/2})_{0.60}(PhSiO_{3/2})_{0.40}$

The following component was used as component (D).

Component (D-1): 1,3,5,7-tetramethyl-1,3,5,7-tetravinyl cyclotetrasiloxane solution of platinum-1,3-divinyl-1,1,3,3-tetramethyl disiloxane complex (solution containing 0.1% by weight of a platinum metal)

The following component was used as component (E).

Component (E-1): 1-ethynylcyclohexan-1-ol

The following component was used as component (F).

Component (F-1): an adhesion imparting agent having a viscosity of 30 mPa·s and comprising a condensation reaction product of 3-glycidoxypropyl trimethoxysilane and methylvinylsiloxane oligomer capped at both molecular terminals with silanol groups.

TABLE 1

| | | Practical Example | | | | | | | |
|---|---|---|---|---|---|---|---|---|---|
| | | 1 | 2 | 3 | 4 | 5 | 6 | 7 | 8 |
| Composition of curable silicone composition (parts by weight) | (A-1) | 83.4 | 90.4 | — | — | 82.9 | 75.4 | — | — |
| | (A-2) | — | — | 81.9 | 82.0 | — | — | — | — |
| | (A-4) | — | — | — | — | — | — | 83.2 | 75.5 |
| | (B-1) | 7.6 | 3.8 | 3.0 | 2.9 | — | — | 7.6 | — |
| | (B-2) | 0.4 | 0.2 | — | 0.2 | 0.4 | 0.7 | 0.4 | 0.7 |
| | (B-4) | — | — | — | — | 7.6 | — | — | — |
| | (B-5) | — | — | — | — | — | 13.3 | — | 13.3 |
| | (C-1) | 7.6 | 4.6 | — | — | 8.1 | 9.6 | 7.8 | 9.5 |
| | (C-2) | — | — | 14.1 | 14.0 | — | — | — | — |
| | (D-1)* | 2 | 2 | 2 | 2 | 2 | 2 | 2 | 2 |
| | (E-1) | 0.05 | 0.05 | 0.05 | 0.05 | 0.05 | 0.05 | 0.05 | 0.05 |
| | (F-1) | 0.5 | 0.5 | 0.5 | 0.5 | 0.5 | 0.5 | 0.5 | 0.5 |
| Amount of vinyl groups in component (B) (% by weight) | | 18.0 | 18.0 | 18.7 | 17.7 | 19.5 | 11.9 | 18.0 | 11.9 |
| SiH/Vi | | 1.1 | 1.1 | 1.1 | 1.1 | 1.1 | 1.2 | 1.1 | 1.2 |
| Viscosity (mPa · s) | | 6600 | 8700 | 1000 | 1100 | 6100 | 4900 | 4800 | 3700 |
| Refractive Index | | 1.471 | 1.474 | 1.530 | 1.530 | 1.470 | 1.465 | 1.452 | 1.448 |
| Hardness (Shore A) | | 49 | 30 | 53 | 55 | 50 | 62 | 48 | 61 |
| Weight Reduction | | ◯ | ◯ | ◯ | ◯ | ◯ | ◯ | ◯ | ◯ |
| Hardness Change | | ◯ | ◯ | ◯ | ◯ | ◯ | ◯ | ◯ | ◯ |
| Crack Resistance | | ◯ | ◯ | ◯ | ◯ | ◯ | ◯ | ◯ | ◯ |

TABLE 2

|  |  | Practical Example | | | | |
| --- | --- | --- | --- | --- | --- | --- |
|  |  | 9 | 10 | 11 | 12 | 13 |
| Composition of curable silicone composition (parts by weight) | (A-5) | 83.1 | — | — | — | — |
|  | (A-6) | — | 83.2 | — | — | — |
|  | (A-7) | — | — | 82.4 | — | — |
|  | (A-8) | — | — | — | 82.5 | — |
|  | (A-9) | — | — | — | — | 84.5 |
|  | (B-1) | 7.6 | 7.6 | 7.6 | 7.6 | 4.8 |
|  | (B-2) | 0.4 | 0.4 | 0.4 | 0.4 | 0.3 |
|  | (C-1) | 7.9 | 7.8 | 8.6 | 8.5 | — |
|  | (C-2) | — | — | — | — | 9.5 |
|  | (D-1)* | 2 | 2 | 2 | 2 | 2 |
|  | (E-1) | 0.05 | 0.05 | 0.05 | 0.05 | 0.05 |
|  | (F-1) | 0.5 | 0.5 | 0.5 | 0.5 | 0.5 |
| Amount of vinyl groups in component(B) (% by weight) |  | 18.0 | 18.0 | 18.0 | 18.0 | 17.8 |
| SiH/Vi |  | 1.1 | 1.1 | 1.1 | 1.1 | 1.1 |
| Viscosity (mPa·s) |  | 3700 | 8300 | 600 | 1000 | 5300 |
| Refractive Index |  | 1.459 | 1.479 | 1.431 | 1.451 | 1.510 |
| Hardness (Shore A) |  | 50 | 49 | 56 | 56 | 46 |
| Weight Reduction |  | ○ | ○ | ○ | ○ | ○ |
| Hardness Change |  | ○ | ○ | ○ | ○ | ○ |
| Crack Resistance |  | ○ | ○ | ○ | ○ | ○ |

TABLE 3

|  |  | Comparative Example | | | | |
| --- | --- | --- | --- | --- | --- | --- |
|  |  | 1 | 2 | 3 | 4 | 5 |
| Composition of curable silicone composition (parts by weight) | (A-1) | 69.6 | 73.3 | — | — | — |
|  | (A-3) | — | — | 65.8 | 83.2 | 87.8 |
|  | (B-1) | — | — | — | — | 4.8 |
|  | (B-2) | 1.1 | 1.0 | 1.3 | 0.6 | 0.3 |
|  | (B-3) | 20.9 | 19.0 | 23.8 | 10.5 | — |
|  | (C-1) | 7.4 | 5.6 | 8.2 | 4.7 | 6.1 |
|  | (D-1)* | 2 | 2 | 2 | 2 | 2 |
|  | (E-1) | 0.05 | 0.05 | 0.05 | 0.05 | 0.05 |
|  | (F-1) | 0.5 | 0.5 | 0.5 | 0.5 | 0.5 |
| Amount of vinyl groups in component(B) (% by weight) |  | 5.3 | 5.3 | 5.4 | 5.3 | 17.8 |
| SiH/Vi |  | 1.2 | 1.0 | 1.2 | 1.2 | 1.2 |
| Viscosity (mPa·s) |  | 4300 | 5000 | 1000 | 1600 | 1800 |
| Refractive Index |  | 1.459 | 1.462 | 1.406 | 1.405 | 1.406 |
| Hardness (Shore A) |  | 48 | 29 | 52 | 33 | 39 |
| Weight Reduction |  | X | X | X | X | ○ |
| Hardness Change |  | ○ | X | X | X | X |
| Crack Resistance |  | Δ | Δ | X | X | X |

INDUSTRIAL APPLICABILITY

The curable silicone composition of the present invention forms a cured product with little weight reduction, little change in hardness, and little crack generation after thermal aging, making it useful as a sealing agent, coating agent, or adhesive of various electrical and electronic components, and particularly useful as a sealing agent, coating agent, or adhesive of an optical semiconductor element in optical semiconductor devices.

REFERENCE NUMERALS

1 Optical semiconductor element
2 Lead frame
3 Lead frame
4 Bonding wire
5 Frame material
6 Cured product of curable silicone composition

The invention claimed is:
1. A curable silicone composition comprising:
(A) 100 parts by weight of a linear organopolysiloxane having at least two silicon atom-bonded alkenyl groups per molecule, wherein at least 5 mole % of all silicon atom-bonded organic groups are aryl groups;
(B) 1 to 100 parts by weight of an organopolysiloxane containing siloxane units represented by the general formula $R^1_3SiO_{1/2}$ where each $R^1$ represents an independently selected monovalent hydrocarbon group, and siloxane units represented by the general formula $SiO_{4/2}$, wherein the amount of alkenyl groups is at least 10% by weight;
(C) an organopolysiloxane having at least two silicon atom-bonded hydrogen atoms per molecule, in an amount that the silicon atom-bonded hydrogen atoms in the component is 0.1 to 10 moles with regard to 1 mole of the total alkenyl groups included in components (A) and (B);

(D) a hydrosilylation reaction catalyst, in an amount that promotes curing of the composition; and (F) an adhesion promoter, in an amount of 0.01 to 10 parts by weight with regard to 100 parts by weight of a total amount of components (A) to (C).

2. The curable silicone composition according to claim 1, further comprising:

(E) a hydrosilylation reaction inhibitor, in an amount of 0.01 to 3 parts by weight with regard to 100 parts by weight of a total amount of components (A) to (C).

3. A cured product formed by curing the curable silicone composition according to claim 2.

4. An optical semiconductor device, wherein an optical semiconductor element is sealed by a cured product of the curable silicone composition according to claim 2.

5. A cured product formed by curing the curable silicone composition according to claim 1.

6. An optical semiconductor device, wherein an optical semiconductor element is sealed by a cured product of a curable silicone composition comprising:

(A) 100 parts by weight of a linear organopolysiloxane having at least two silicon atom-bonded alkenyl groups per molecule, wherein at least 5 mole % of all silicon atom-bonded organic groups are aryl groups;

(B) 1 to 100 parts by weight of an organopolysiloxane containing siloxane units represented by the general formula $R^1_3SiO_{1/2}$ where each $R^1$ represents an independently selected monovalent hydrocarbon group, and siloxane units represented by the general formula $SiO_{4/2}$ wherein the amount of alkenyl groups is at least 10% by weight;

(C) an organopolysiloxane having at least two silicon atom-bonded hydrogen atoms per molecule, in an amount that the silicon atom-bonded hydrogen atoms in the component is 0.1 to 10 moles with regard to 1 mole of the total alkenyl groups included in components (A) and (B); and (D) a hydrosilylation reaction catalyst, in an amount that promotes curing of the composition.

7. The optical semiconductor device according to claim 6, wherein the curable silicone composition further comprises:

(F) an adhesion promoter, in an amount of 0.01 to 10 parts by weight with regard to 100 parts by weight of a total amount of components (A) to (C).

8. The optical semiconductor device according to claim 6, wherein the curable silicone composition further comprises:

(E) a hydrosilylation reaction inhibitor, in an amount of 0.01 to 3 parts by weight with regard to 100 parts by weight of a total amount of components (A) to (C).

* * * * *